United States Patent [19]

Arndt

[11] 3,965,376

[45] *June 22, 1976

[54] PULSED DROPLET EJECTING SYSTEM

[75] Inventor: John P. Arndt, Cleveland, Ohio

[73] Assignee: Gould Inc., Rolling Meadows, Ill.

[ * ] Notice: The portion of the term of this patent subsequent to Aug. 27, 1991, has been disclaimed.

[22] Filed: July 12, 1974

[21] Appl. No.: 487,876

Related U.S. Application Data

[62] Division of Ser. No. 330,360, Feb. 7, 1973, Pat. No. 3,832,579

[52] U.S. Cl. .................................. 310/8.5; 310/9.1

[51] Int. Cl.² .......................................... H01L 41/08

[58] Field of Search ............... 310/8.1, 8.2, 8.3, 8.5, 310/9.5, 9.6, 9.1; 346/75, 140

[56] References Cited

UNITED STATES PATENTS

| | | | |
|---|---|---|---|
| 3,683,212 | 8/1972 | Zoltan | 310/8.3 |
| 3,708,798 | 1/1973 | Hildenbrand et al. | 346/140 |

*Primary Examiner*—Mark O. Budd

[57] ABSTRACT

A reservoir supplies liquid through a conduit to a nozzle. The liquid is under small or zero static pressure. Surface tension at the nozzle prevents liquid flow when the system is not actuated. A section of the conduit terminating at the nozzle is designed to be capable of conducting pressure waves in the liquid from end to end of the section without the occurence of significant reflections within the section. An electroacoustic transducer is coupled to the liquid in the reflection-free section. When an electric pulse is applied to the transducer it applies a pressure pulse to the liquid sending a pressure wave to the nozzle where it causes ejection of a droplet. The pressure pulse also sends a pressure wave in the opposite direction. The system has energy absorbing means coupled to the liquid and adapted to absorb substantially all of the energy of the latter wave, thus preventing reflections which could return to the nozzle and interfere with ejection of a subsequent droplet.

4 Claims, 2 Drawing Figures

PULSED DROPLET EJECTING SYSTEM

This application is a division of application Ser. No. 330,360, filed Feb. 7, 1973, now U.S. Pat. No. 3,832,579 and assigned to the same assignee as the present application.

BACKGROUND OF THE INVENTION

1. Field of the Invention

This invention pertains to a system for ejecting droplets of liquid on command suitable for use in apparatus such as ink jet printers and facsimile recorders.

2. Description of the Prior Art

This invention is an improvement on the system described in U.S. Pat. No. 3,683,212, issued to Steven I. Zoltan on Aug. 8, 1972, and assigned to the same assignee as the present invention.

A system constructed as described in the Zoltan patent having the dimensions cited by way of example works very well when the pulse rate is less than about one kH. If the pulsing is continuous and the pulse rate is gradually increased above about one kH, alternate increases and decreases in droplet velocity may be observed.

When a burst of pulses equally spaced in time is applied to the system, and the time interval between pulses exceeds about one millisecond, the resulting droplets are ejected with uniform spacing. However, when the time between pulses is decreased to a fraction of a millisecond, the first several droplets which are ejected generally have irregular spacing.

The above described irregularities are undesirable in many applications. An experimental and theoretical investigation has shown that they are caused by acoustic resonances, reflections, and interference phenomena in the liquid in the system.

OBJECT AND SUMMARY OF THE INVENTION

The object of this invention is to provide a droplet on command system generally similar to the system described in FIG. 6 of U.S. Pat. No. 3,683,212 but which is substantially free of the irregular performance at high pulse rates observed in systems constructed as described in that patent.

According to the invention a reservoir supplies liquid through a conduit to a nozzle. A substantial length of the conduit comprises viscoelastic material. A plate-like piezoelectric transducer having two opposed major faces is coupled substantially only at an edge portion thereof to the liquid within the length of conduit which comprises viscoelastic material. Substantially the full areas of the major faces of the transducer are free of coupling to the liquid. The transducer is adapted to expand parallel to the major faces when an electric pulse is applied thereto. This pulsed expansion applies a pressure pulse to the liquid causing ejection of liquid from the nozzle.

BRIEF DESCRIPTION OF THE DRAWINGS

For a better understanding of the present invention, together with other and further objects thereof, reference is had to the following description taken in connection with the accompanying drawings, and its scope will be pointed out in the appended claims.

In the drawings.

DESCRIPTION OF THE PREFERRED EMBODIMENT

Figure 1:
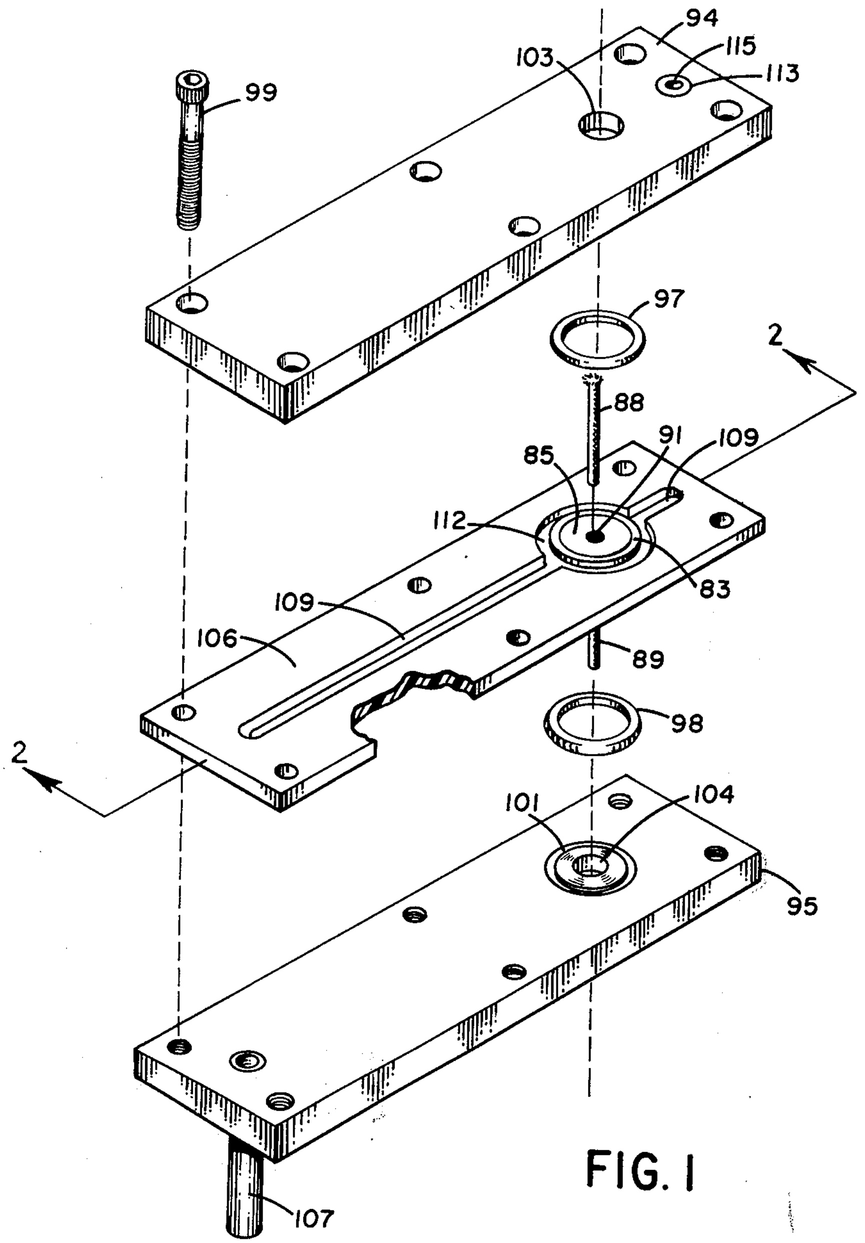
FIG. 1 is an exploded view of a system according to the invention.
Figure 2:
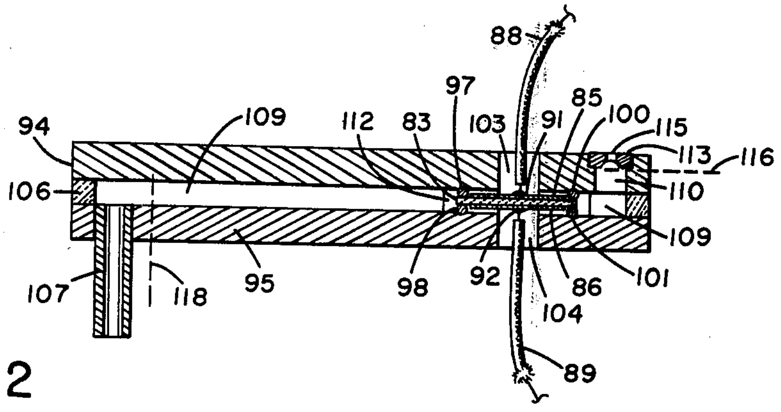
FIG. 2 is a conventional sectional view along lines 2—2 of FIG. 1.

In FIGS. 1 and 2 piezoelectric disc 83, preferably of lead zirconate-lead titanate ceramic, has electrodes 85,86 to which terminal wires 88,86 are attached by solder or conductive epoxy 91,92.

Piezoelectric disc 83 is clamped between metal or plastic cover plates 94,95 by O-rings 97,98 which fit into grooves 100,101 in the cover plates. Terminal wires 88,89 extend through openings 103,104 in the cover plates.

Also clamped between covers 94,95 is a sheet 106 of viscoelastic material such as plasticized polyvinyl chloride. The assembly is held together by screws 99 which exert sufficient compressive force on sheet 106 and O-rings 97,98 to prevent leakage of liquid from the conduit formed as described in the next paragraph.

Sheet 106 has an elongated cut-out 109 intersecting circular cut-out 112 which surrounds piezoelectric disc 83 and O-rings 97,98. Tubular member 107 of metal or plastic is secured to cover 95 and communicates with cut-out 109 at one end thereof. Opening 110 through cover 94 communicates with cut-out 109 at the other end. Thus there is formed a conduit comprising tubular member 107, cut-out 109 enclosed by covers 94,95, opening 110, and an annular space formed by cut-out 112, the rim of piezoelectric disc 83, O-rings 97,98 and cover plates 94,95. The conduit is terminated at one end by sapphire watch jewel 113 which serves as a droplet ejecting nozzle. The other end of the conduit, i.e., the open end of tubular member 107, may be immersed in liquid in a reservoir, not shown, or may be coupled to liquid in a reservior by an additional conduit member such as a flexible tube. The entire conduit and the opening 115 in nozzle 113 are filled with the liquid.

The reservoir is maintained at an elevation which applies little or no pressure to the liquid in orifice 115. A slight negative pressure, on the order of two to three centimeters of head seems to be advantageous. Under quiescent conditions, the surface tension of the liquid in orifice 115 prevents flow of liquid in either direction.

To facilitate further description, the section of the above described conduit extending from dashed line 118 to the face of watch jewel 113 at dashed line 116 will be identified as conduit section 118-116. Line 118 marks the inlet end and line 116 marks the outlet end. The location selected for line 118 is not critical but preferably it is considered to be near or at conduit member 107. The internal cross sectional areas of the various components of conduit section 118-116 are selected so that pressure waves in the liquid may travel from end-to-end of the section without the occurrence of significant reflection within the section.

The polarization of piezoelectric disc 83 is in the thickness direction. Thus, when a voltage of suitable polarity is connected between terminals 88 and 89, the diameter of the disc increases. When the voltage is reduced to zero, the disc returns to its original diameter.

The rim of piezoelectric disc 83 forms part of conduit section 118-116 and is in direct contact with the liquid. O-rings 97,98 which also form part of the conduit prevent the liquid from contacting electrodes 83,85. Thus, when a voltage pulse with polarity that causes increase of diameter is applied to transducer 83 the liquid surrounding the transducer is momentarily compressed. This causes a pressure wave to travel through the liquid in conduit section 118-116 to the outlet end 116 thereof and eject a droplet from nozzle 113. It also causes a pressure wave to travel through the liquid toward inlet end 118. As the latter wave progresses from the rim of transducer disc 83 it causes elastic deformation of the viscoelastic material of sheet 106 progressively along the length of conduit section 118-116, with consequent absorption of wave energy. After the wave passes inlet end 118 it at some point encounters an impedance discontinuity and therefore it is at least partially reflected. As the reflected wave progresses toward nozzle 113 it experiences further attenuation due to energy absorption in the viscoelastic walls of the conduit. The conduit section 118-116 is made sufficiently long so that the reflected wave energy reaching nozzle 113 is too weak to interfere with ejection of subsequently initiated droplets.

The pulse shape requirement is not critical. It is advantageous to have rise time less than two microseconds, dwell time of five to fifty microseconds, and fall time greater than two microseconds. Good results also may be obtained using a cosine squared pulse shape with period of ten to one hundred microseconds.

Many electric circuit arrangements can be devised for generating and applying suitable electric drive pulses. For examples of such circuits, reference may be made to U.S. Pat. No. 3,683,212 to Zoltan.

While there has been described what is at present considered to be the preferred embodiment of this invention, it will be obvious to those skilled in the art that various changes and modifications may be made therein without departing from the invention, and it is aimed, therefore, in the appended claims to cover all such changes and modifications as fall within the true spirit and scope of the invention.

What is claimed is:

1. In a pulsed droplet ejecting system having a reservoir containing liquid; having a conduit communicating with said liquid in said reservoir and filled with said liquid; having a nozzle terminating said conduit and filled with said liquid; and having a transducer coupled to the liquid in said conduit and adapted to apply a pressure pulse to said liquid when an electric pulse is applied to said transducer thereby causing ejection of liquid from said nozzle, the improvement which comprises:

said conduit comprising viscoelastic material extending along a substantial length of said conduit in contact with said liquid;

said transducer comprising a piezoelectric plate having two opposed major faces with electrodes thereon, and electric terminals connected to said electrodes, said transducer being coupled substantially only at an edge portion thereof to said liquid within said length of conduit which comprises viscoelastic material, substantially the full areas of said major faces being free of coupling to said liquid, and said transducer being adapted to expand parallel to said major faces when an electric pulse is applied to said terminals thereby applying a pressure pulse to said liquid causing ejection of liquid from said nozzle, said conduit being dimensioned relative to the properties of the liquid and to the viscoelastic propeties of the conduit material so that reflected wave energy therein caused by an ejected droplet is too weak to substantially interfere with the ejection of a subsequent droplet.

2. The improvement in the pulsed droplet ejecting system described in claim 1 further characterized in that said conduit comprises an elongated narrow cut-out portion intersecting an enlarged cut-out portion in a sheet of viscoelastic material which is clamped between two housing members, and said transducer is disposed within said enlarged cut-out portion with sealing means between each of said major faces at the peripheries thereof and an adjacent housing member.

3. The improvement in the pulsed droplet ejecting system described in claim 2 further characterized in that said enlarged cut-out is substantially circular, said transducer is substantially circular, and is substantially centrally disposed within said enlarged cut-out.

4. The improvement in the pulsed droplet ejecting system described in claim 3 further characterized in that said sealing means comprise O-rings compressed between said substantially circular transducer and said housing members.

* * * * *